United States Patent
Matsuoto et al.

(10) Patent No.: US 6,433,986 B1
(45) Date of Patent: Aug. 13, 2002

(54) DEVICE HAVING ELECTRICAL BOARD MOUNTED THEREON AND METHOD FOR MANUFACTURING APPARATUS HAVING THE DEVICE

(75) Inventors: Hideaki Matsuoto, Hachioji; Tatsuya Suzuki, Tokyo; Tatsuo Takanashi, Hachioji, all of (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/548,921

(22) Filed: Apr. 13, 2000

(30) Foreign Application Priority Data

Apr. 20, 1999 (JP) ............................. 11-112190
Apr. 21, 1999 (JP) ............................. 11-113606

(51) Int. Cl.$^7$ ............................................... H01H 73/00
(52) U.S. Cl. ........................ 361/115; 361/752; 361/790
(58) Field of Search ................................. 361/115, 752, 361/801, 800, 810, 818, 790, 792, 58

(56) References Cited

U.S. PATENT DOCUMENTS 5,357,065 A * 10/1994 Mitamura ................... 200/5 A
6,118,347 A * 9/2000 Ohira .......................... 331/68

* cited by examiner

Primary Examiner—Stephen W. Jackson
(74) Attorney, Agent, or Firm—Frishauf, Holtz, Goodman, Langer & Chick, P.C.

(57) ABSTRACT

An electrical board is provided which includes a switch pattern disposed in a device or apparatus such as a camera, for example, for receiving an operation input in response to an operation from the exterior, and a connection land portion formed to be continuous with the switch pattern. Further, an electrical board device is provided which uses first electrical board as a first electrical board, and which further includes a second electrical board having a different switch pattern formed in a position different from the switch pattern of the first electrical board and connected to the connection land portion of the first electrical board. Thus, devices having different external appearances can be attained even if the devices require the same specification, and the board space can be efficiently used and the board itself can be made small.

20 Claims, 4 Drawing Sheets

DEVICE HAVING ELECTRICAL BOARD MOUNTED THEREON AND METHOD FOR MANUFACTURING APPARATUS HAVING THE DEVICE

CROSS-REFERENCE TO RELATED APPLICATIONS

This application is based upon and claims the benefit of priority from the prior Japanese Patent Applications No. 11-112190, filed Apr. 20, 1999; and No. 11-113606, filed Apr. 21, 1999, the entire contents of which are incorporated herein by reference.

BACKGROUND OF THE INVENTION

This invention relates to an electrical board commonly used for different devices and an electrical board device having the electrical board mounted thereon, for example, an electrical board device for effectively utilizing the board space by separately providing printed wiring boards each having a switch input pattern or the like formed thereon and a method for manufacturing an apparatus having the above electrical board device.

In recent years, an attempt has been made to save space and reduce the number of parts by combining preset boards or designing the board to be commonly used. For this purpose, for example, a design for forming a switch pattern in a circuit pattern and bringing an operation member into direct contact therewith to effect the circuit switching is used.

Further, in order to effectively utilize the electrical board, the board has been designed to be a common board so that it can be mounted on as many different types of devices as possible. In this connection, it is noted that the diversity of not only the color but also the external appearance of a device assembled as a product is required, and it is also required to produce various types of products of a small number by using parts supplied.

However, when the conventional uniform electrical board is mounted on one of a plurality of different types of devices, the operation input position of a button of the operation member tends to be determined in the same position and the diversity of the design or the like for a plurality of different types of devices has a limitation.

Further, the similarity of the external appearance of the products may not be caused by the external appearance of the device itself, but the uniformity of the electrical board used for the device may be the main cause in many cases. That is, the degree of freedom is low in the arrangement position and the direction of outer covering parts including an operation member which is directly or indirectly connected to the board, and the circuit design and board construction in which only one specification and one connecting configuration are permitted are often observed.

In order to provide the individualities of discrete products for many products, it is required to realize a specification of external appearance for giving different impressions of the external appearances simply by slightly changing the arrangement of a common part. Further, it is required to provide for variations in the external appearance and operability in order that the electrical board can be used in various apparatuses, for example, such as cameras.

As described above, a change can be made possible to some extent (variations) by considering the construction of the electrical board and the layout of the circuit pattern, but it is difficult in practice and no concrete method has been achieved.

Further, in the conventional electric device, a printed wiring board having, various types of electrical parts mounted thereon is mounted to perform the various electrical control operations. For example, in the case of a camera, a flexible printed wiring board is provided on which a central operation processing unit (CPU) for controlling the whole portion of the camera, an interface of the CPU, an EEPROM which is a nonvolatile memory, and a date CPU for controlling the date printing operation and the like are mounted, and the above units are electrically connected to one another via a wiring pattern.

In the first prior art, as shown in FIG. 6, a switch input pattern 101 for electrical switching is formed on a printed wiring board 100, a wiring pattern 104 is formed in an area other than the forming area of the switch input pattern 101, the switch input pattern 101 and an IC chip 103 are electrically connected together, and the IC chip 103 and another IC chip 102 are electrically connected via the wiring pattern 104.

Further, in the second prior art, in a case where a flexible printed wiring board is used as the above printed wiring board, it is commonly effected to provide a preset arm portion on the flexible printed wiring board, form a preset switch input pattern on the arm portion and bend and use the arm portion when it is actually applied to a camera or the like.

However, in the first prior art, since it is necessary to form the wiring pattern 104 or the like in an area other than the switch input pattern 101, the area of the printed wiring board 100 becomes large and the cost thereof is increased. In this respect, it is required to efficiently use the area of the printed wiring board 100.

Particularly, when the flexible printed wiring board is used, it is possible to fold and accommodate the same in the camera or the like, for example, but if a hard printed wiring board is used, enlargement of the board causes the camera itself to be enlarged.

Further, as in the second prior art, in a case where the flexible printed wiring board is used, the efficiency of taking out the material of the flexible printed wiring board is lowered in the manufacturing process if the arm portion for forming the switch input pattern is formed, and as a result, there occurs a problem that the cost thereof is increased.

(Object)

This invention has been made by taking the above problems into consideration and an object of this invention is to provide an electrical board device always having the same specification but which enables different external appearances.

Another object of this invention is to provide an electrical board device in which the board space can be efficiently used and the board itself can be made small.

Still another object of this invention is to provide a method for manufacturing the above device.

BRIEF SUMMARY OF THE INVENTION

In order to solve the above problem and attain the above objects, the following measure is taken in this invention. In this invention, the electrical board is so designed as to be commonly used in devices having different external appearances and the electrical board is selectively mounted on one of the devices having different external appearances.

According to a first embodiment, an electrical board device having an electrical board to be arranged in an apparatus is proposed which comprises a switch pattern for receiving an input in response to an external operation; and a connection land portion formed to be continuous to the switch pattern.

Further, a device is proposed which has an electrical board arranged in a preset apparatus and comprises a first electrical board which includes a switch pattern for receiving an operation input in response to an operation from the exterior and a land portion for connection formed to be continuous to the switch pattern; and a second electrical board having a switch pattern connected to the connection land portion and formed in an area other than the switch pattern.

According to a second embodiment, a method for manufacturing an apparatus including the electrical board device with the above construction is proposed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

There will now be described in detail the main portion of this invention by using a plurality of embodiments with reference to the accompanying drawings.

This application claims benefit of Japanese Applications No. 11-112190 filed Apr. 20, 1999; and No. 11-113606 filed Apr. 21, 1999, the contents of which are incorporated hereinto by this reference.

(First Embodiment)

Figure 1A:
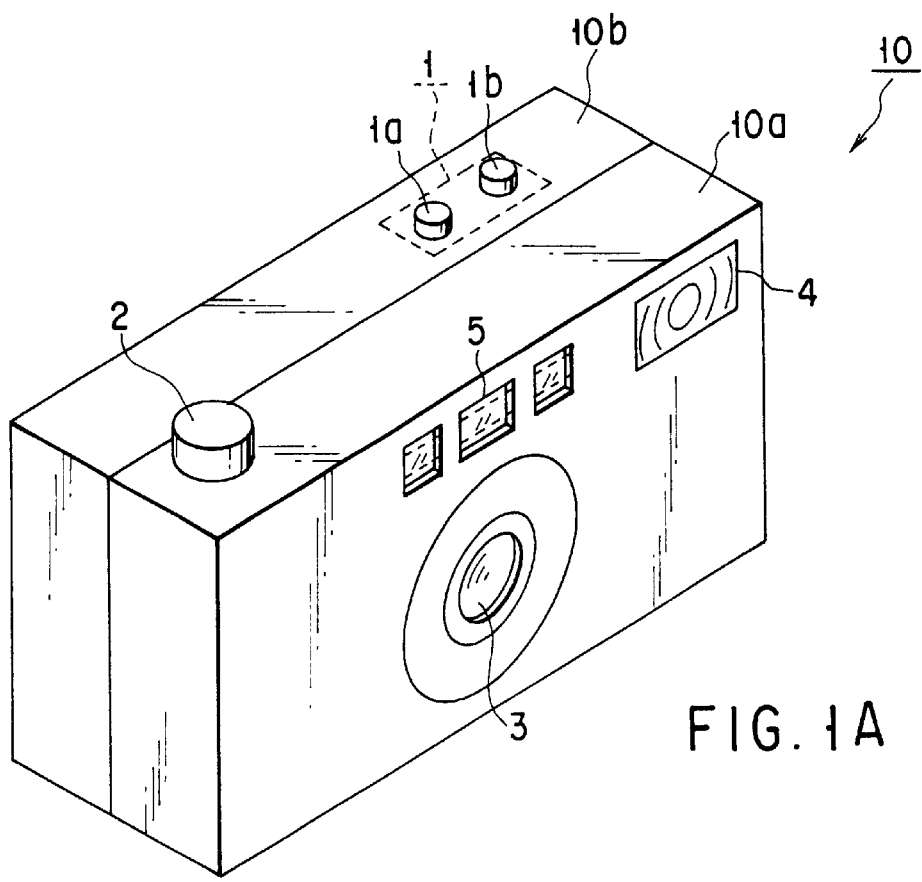
FIGS. 1A, 1B show the external appearance of a camera having an electrical board according to this invention mounted thereon, FIG. 1A being a perspective view of a simplified camera with a rectangular cover and FIG. 1B being a perspective view of a simplified camera with a rounded cover.
Figure 1B:
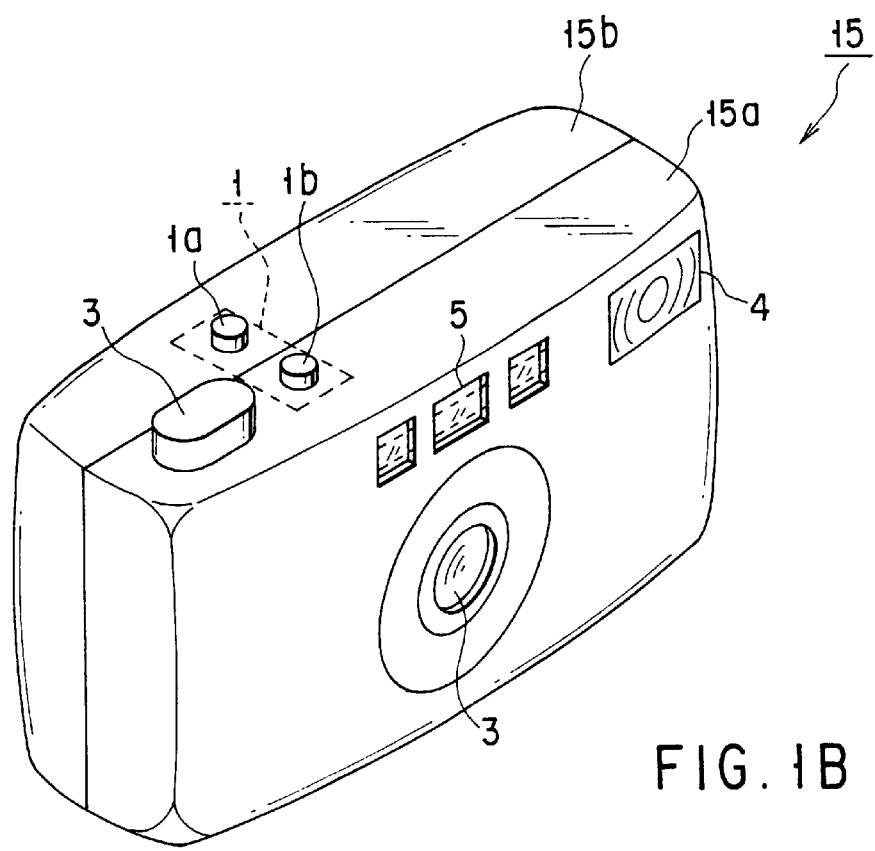

The external appearances of cameras having electrical boards of this invention mounted thereon are shown in FIGS. 1A, 1B, an example shown in FIG. 1A is a simplified camera with a rectangular body and an example shown in FIG. 1B is a simplified camera with a rounded body.

A rectangular type camera body (main body unit cover) 10 shown in FIG. 1A has a front cover 10a and a rear cover 10b and the internal parts thereof cover the front and rear portions of a common main body unit. Two buttons 2a, 2b are projected as operation members arranged side by side on the upper surface of the rear cover 10b and one cylindrical release button 2 is projected on the upper surface of the front cover 10a.

The buttons 1a, 1b are arranged in a row on a button member 1, the button member 1 is one of common parts (which are described in detail later) which can be commonly used for different types of cameras, and particularly in this example, two buttons are arranged in the lateral direction (in the lengthwise direction on the upper surface) on the left-hand side of the operator. Further, the release button 2 has a feature that the shape of the projected portion thereof is cylindrical.

In the front surface of the front cover 10a, a photographing lens 3, stroboscopic window 4 and finder window 5 are provided and corresponding portions of the main body unit correspond to the above elements.

A rounded type camera body (main body unit cover) 15 shown in FIG. 1B has a front cover 15a and a rear cover 15b and the internal parts thereof cover a common main body unit. However, in this example, the shape of a projecting portion of a release button 2 is not cylindrical but is formed in a large-sized substantially elliptical form as one variation of the design.

Further, buttons 1a and 1b are arranged in a row in a longitudinal direction (that is, in the direction of optical axis) on the right-hand side of the operator on a button member 1 which is a common part commonly used in the same manner as the above-described button member 1 having the buttons 1a and 1b arranged in a row as one variation of the design.

Of course, in the front surface of the front cover 15a, a photographing lens 3, stroboscopic window 4 and finder window 5 which are basic parts of the camera are provided in corresponding positions.

It is understood that even if the above common parts (the main body unit and electrical board of the camera (which will be described in detail later)) are mounted inside the front and rear covers, cameras having a plurality of different impressions of the external appearance can be obtained by changing the arrangement direction and arrangement position of various types of operation members such as switches and buttons as required. As a result, the usability of the camera by the operator and the impression of the external appearance thereof are changed and the diversity in the design of the product can be attained by providing the degree of freedom of the arrangement of the common electrical boards.

Figure 2A:
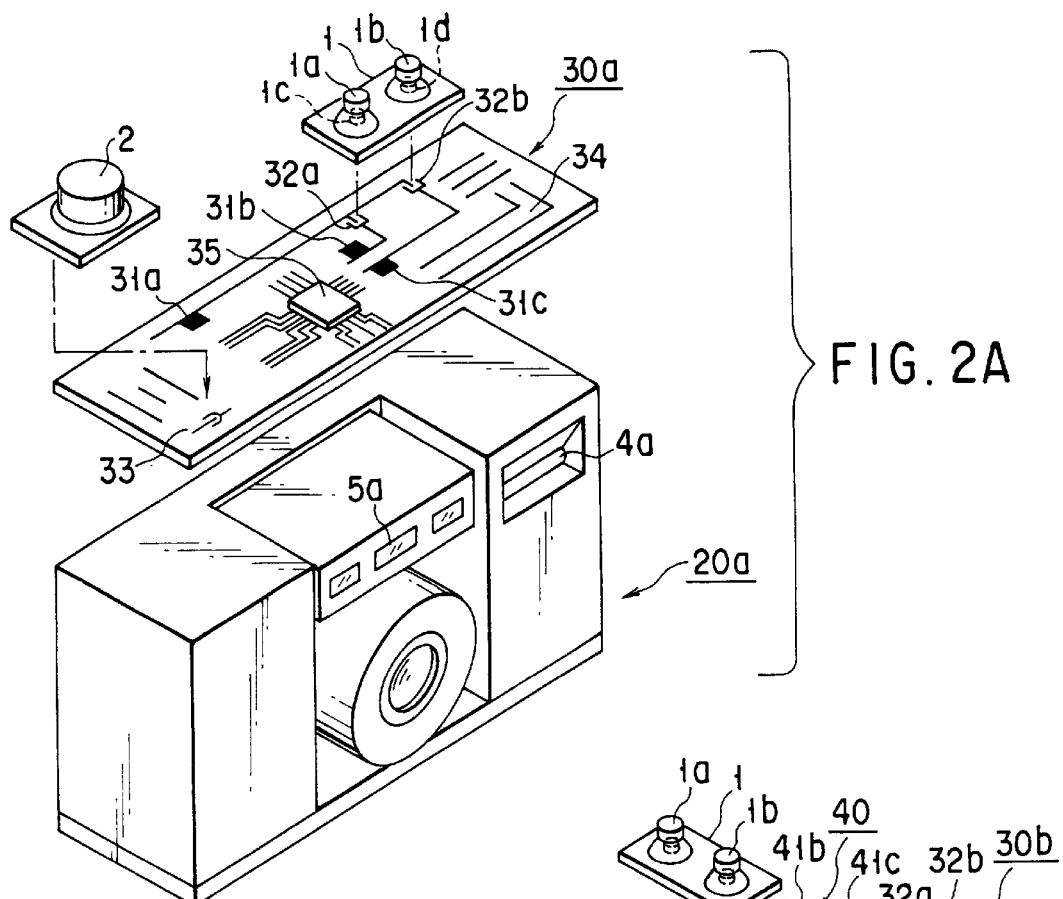
FIGS. 2A, 2B show the assembling of a common electrical board of the first embodiment of this invention and a camera main body unit, FIG. 2A being an assembling view showing a button member arranged on the common electrical board and FIG. 2B being an assembling view showing a button member arranged on the common electrical board with a button board disposed therebetween.
Figure 2B:
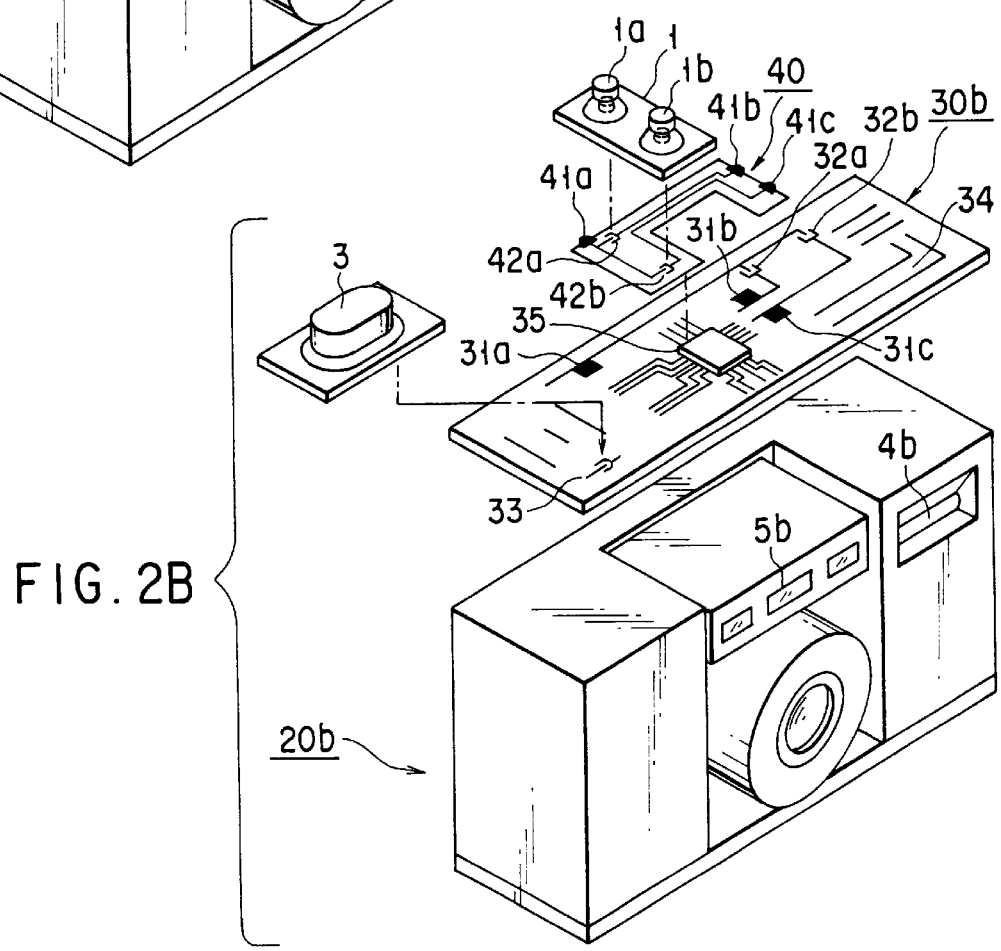

FIGS. 2A, 2B show the states in which first electrical boards (30a, 30b) used as a common electrical board of this invention and camera main body units and the like are assembled. The main body units 20a, 20b are also used as a unit of substantially the common specification and are one of the common parts.

More specifically, according to the assembling view of FIG. 2A, a common board 30a mounted on the upper portion of the main body unit 20a having a stroboscopic unit 4a and finder 5a mounted on the front surface thereof and a button member 1 and release button 2 mounted on the preset pattern on the common board 30a are sequentially assembled. It is also understood that the button member 1 is arranged so as to arrange two buttons 1a, 1b in a row in the lateral direction on the common electrical board 30a.

Preset circuit patterns, for example, switch patterns 32a, 32b, release pattern 33 and another circuit pattern 34 are formed on the common board 30a which is mounted on the upper portion of the main body unit 20a as the common part. Thus, the button member 1 having the buttons 1a, 1b is assembled on the switch patterns 32a, 32b and the release button 2 is assembled on the release pattern 33.

Further, on the common board 30a, three connection lands 31a, 31b, 31c which are not used for the camera are formed and are connected to the switch patterns 32a, 32b. A CPU 35 for controlling the whole portion of the camera is provided near the central portion of the common board 30a.

The buttons 1a, 1b provided on the button member 1 are projections which are formed of silicone rubber of small thickness and deformed by depression. On the rear side thereof, electrically conductive rubbers 1c, 1d are respectively provided to make a switching circuit pattern in which the bottom portions of the rubbers are respectively brought into contact with the switch patterns 32a, 32b of the common board 30a by deformation of the rubbers to make a corresponding switch circuit conductive. For example, in this embodiment, a switch pattern having a "U"-shaped pattern and a "–"-shaped pattern as one set is used. The one set of patterns are brought into contact with the electrically conductive rubber to make the circuit pattern electrically conductive.

According to the assembling view of FIG. 2B, a common board 30b mounted on the upper portion of the main body unit 20b which is the same as and commonly used with the main body unit 20a of FIG. 2A. The main body unit 20b has a stroboscopic unit 4b and finder 5b mounted on the front surface thereof. And a button board 40 as a second electrical board exclusively used and formed of a flexible printed board is connected to connection lands 31a, 31b, 31c on the common board 30b. A button member 1 is assembled on the switch pattern on the button board 40, and a release button 3 is assembled on the release pattern 33 of the common board 30b. The above common boards (30a, 30b) are substantially the same in external appearance, while the contents of the ROM in the CPU can be made different as required, and the contents of an EEPROM not shown here can be made different.

Further, the button member 1 is arranged in a direction parallel to the optical axis on the common board 30b with the button member 40 disposed therebetween. That is, as the common part, the button member 40 which is required for changing the direction of the arrangement of the two buttons 1a, 1b is used. Two switch patterns 42a, 42b are provided in positions corresponding to the buttons 1a, 1b on the additionally provided exclusive button member 40. Further, a plurality of connection lands 41a, 41b, 41c for connection with preset patterns (31a, 31b, 31c) of the common board 30b are arranged.

As shown in the assembling view of FIG. 2B, the common board 30b and the button board 40 arranged on the common board are boards having the same pattern from the circuit viewpoint and they are superposed on each other and electrically connected in parallel.

Figure 3:
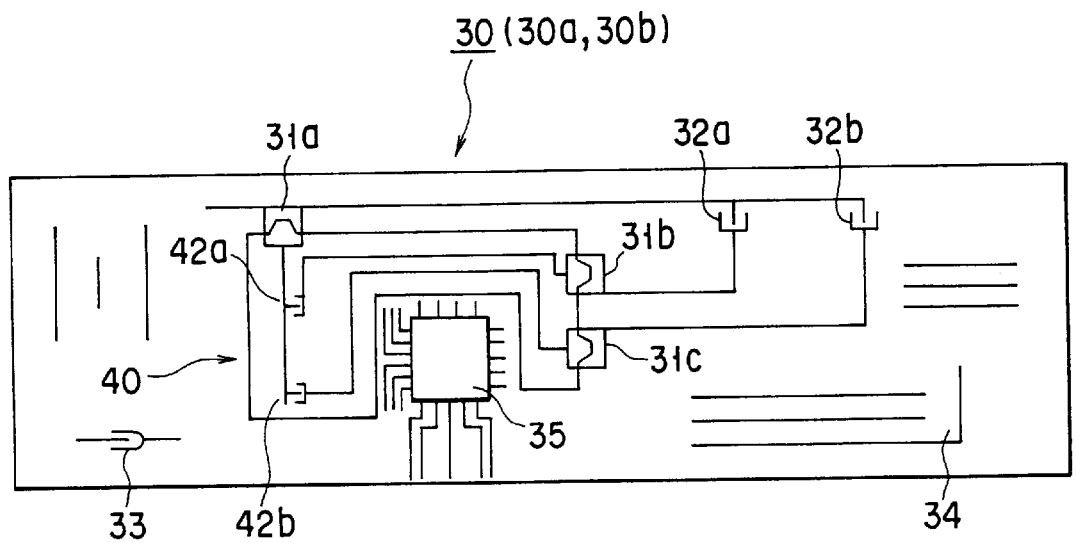
FIG. 3 is a circuit diagram showing the schematic construction of a circuit of the assembled electrical board of the construction shown in FIGS. 2A, 2B.

Next, the first and second electrical boards are more specifically explained with reference to FIG. 3. Three connection land portions 31a, 31b, 31c are formed on the common board 30 (30a, 30b). Further, on the upper right portion, one set of switch patterns 32a, 32b are provided. In addition, as other patterns, the circuit pattern 34, release pattern 33, CPU 35 are provided.

On the common board 30 (30a, 30b), the button board 40 is disposed and preset connecting portions thereof are connected thereto. That is, the connection land portions 41a, 41b, 41c are disposed on the button board 40 in positions corresponding to the connection land portions 31a, 31b, 31c of the common board 30 (30a, 30b). The connection land portions 31a, 31b, 31c are electrically connected to the connection land portions 41a, 41b, 41c by use of solder or the like. Further, the switch patterns 42a, 42b are formed in positions to which the buttons 1a, 1b correspond. Therefore, in this case, the positions in which the two buttons 1a, 1b of the button member 1 are disposed are set closer to the right hand side due to the presence of the switch patterns 42a, 42b which the button board 40 has and the arrangement direction of the buttons 1a, 1b can be changed by 90° in comparison with the case wherein only the common board 30a is used.

Thus, in the photographing device or camera according to the first embodiment, the common board 30 (30a, 30b) combined with the main body unit 20a, 20b is a common electrical board which can be arranged in one of different types of cameras and includes the switch patterns 32a, 32b each of which receives an operation input (via the button) in response to the operation from the exterior by the operator and the connection land portions 31a, 31b, 31c which are formed to be continuous to the switch patterns 32a, 32b.

Further, particularly, in a case where the common board 30 (30a, 30b) having the connection land portions 31a, 31b, 31c is used as a first electrical board in order to make an external appearance different by changing the position and arrangement direction of the buttons 1a, 1b, the button board 40 on which the switch patterns 42a, 42b connected to the connection land portions 31a, 31b, 31c and disposed in positions different from the switch patterns 32a, 32b are formed is used as a second electrical board.

As is understood by comparing the construction and arrangement shown in FIG. 2A with those shown in FIG. 2B, the main body units 20a, 20b and the common boards 30a, 30b use exactly the same type of parts as the components thereof and the button members 1 of the same type are arranged such that the arrangement directions and positions are changed by 90° from each other.

The switch patterns 32a, 32b are formed on the first electrical board used as the common board and the circuit patterns of the switch patterns 42a, 42b are previously formed on the second electrical board which is used exclusively. The electrical boards 30a, 30b used as the first electrical board are widely used for plural types of cameras having different external appearances. It is understood that a difference in the external appearance of the camera product can be produced by differences in the board construction and arrangement, one set of patterns can be selectively used from the above patterns as required at the time of assembling and the operation member can be selectively arranged.

Thus, by changing the position and direction of the operation member including a plurality of buttons 1a, 1b, a different impression and usability can be given to the external appearance of the product and the operability thereof even if substantially the same common parts are used as the components.

(Modification 1-1)

The first embodiment described above can be modified as follows and the effect which is equivalent to or higher than the first embodiment can be expected. For example, if there is a space which lies above the common boards 30a, 30b and in which another circuit pattern can be provided, a circuit pattern equivalent to the button board 40 can be previously formed on the common board 30a, 30b so that the button member 1 can be directly connected to the common board 30a, 30b.

According to the modification, since two types of arrangements of the button 1 (1a, 1b) in which the arrangement directions thereof are different can be attained even if the exclusive button board 40 becomes unnecessary, the number of parts can be further reduced and cameras of different designs can be provided by use of common parts.

(Modification 1-2)

The first embodiment can be modified as follows and the effect which is equivalent to the first embodiment can be expected. For example, the circuit pattern may be formed so as to be used even if it is laterally inverted and a camera for a right-hander may be assembled as a camera for a left-hander, and a switch pattern may be formed on the common board by the circuit design which permits the operation member to be mounted on either the right side or left side. Thus, the camera can be constructed in a modified form to be most suitable for the physical feature of the user.

(Second Embodiment)

Figure 4:
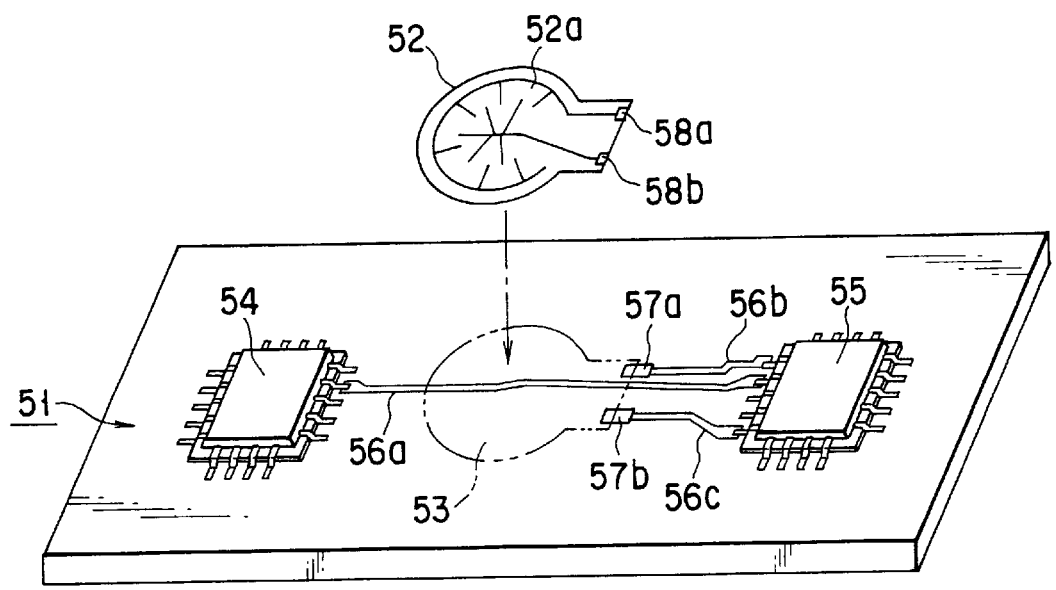
FIG. 4 is a construction view of an electrical board device according to a second embodiment of this invention.

FIG. 4 shows the construction of an electrical board device according to a second embodiment of this invention. As shown in FIG. 4, IC chips 54, 55 are formed on a printed wiring board 51 and electrically connected by use of a wiring pattern 56a.

Further, two connection lands 57a, 57b are formed on wiring patterns 56b, 56c which are led out from the IC chip 55.

On a flexible printed wiring board 52, a switch input pattern 52a is formed and two connection lands 58a, 58b are formed in preset positions of the switch input pattern 52a.

The flexible printed wiring board 52 is disposed on an arrangement area 53 of the printed wiring board 51 to cover the wiring pattern 56a so that the connection lands 58a, 58b may be electrically connected to the connection lands 57a, 57b of the printed wiring board 51 by use of solder or the like.

A first printed wiring board described in the claims corresponds to the printed wiring board 51 and a second printed wiring board corresponds to the printed wiring board 52.

Figure 6:
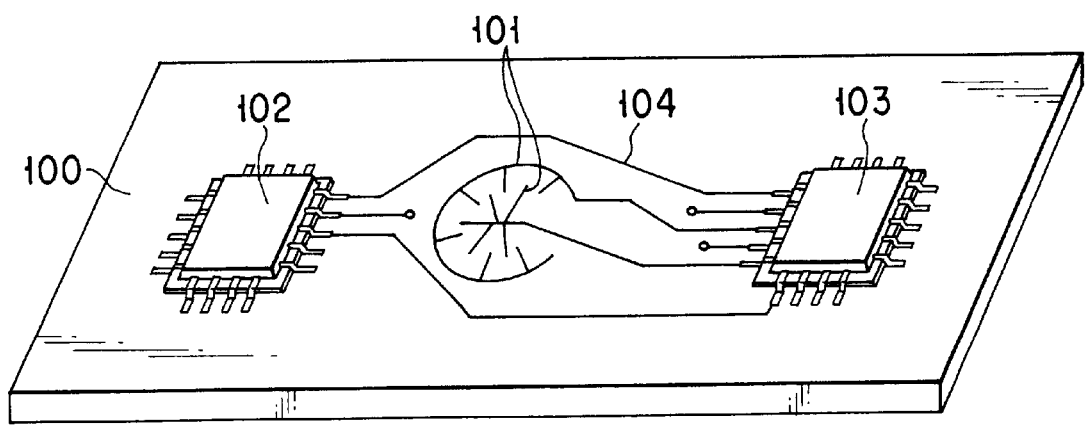
FIG. 6 is a construction view of a conventional electrical board device.

Since the switch input pattern 101 is formed directly on the printed wiring board 100 in the prior art described before, the wiring pattern 104 must be formed in a position other than the area of the switch input pattern 101, and therefore, the space cannot be efficiently used, the board is made larger and the cost thereof is increased (refer to FIG. 6).

On the other hand, according to the second embodiment, since the switch input pattern 52a is formed on the different flexible printed wiring board 52, the space of the printed wiring board 51 can be efficiently used, the board can be made small and the cost thereof can be lowered.

(Third Embodiment)

Figure 5:
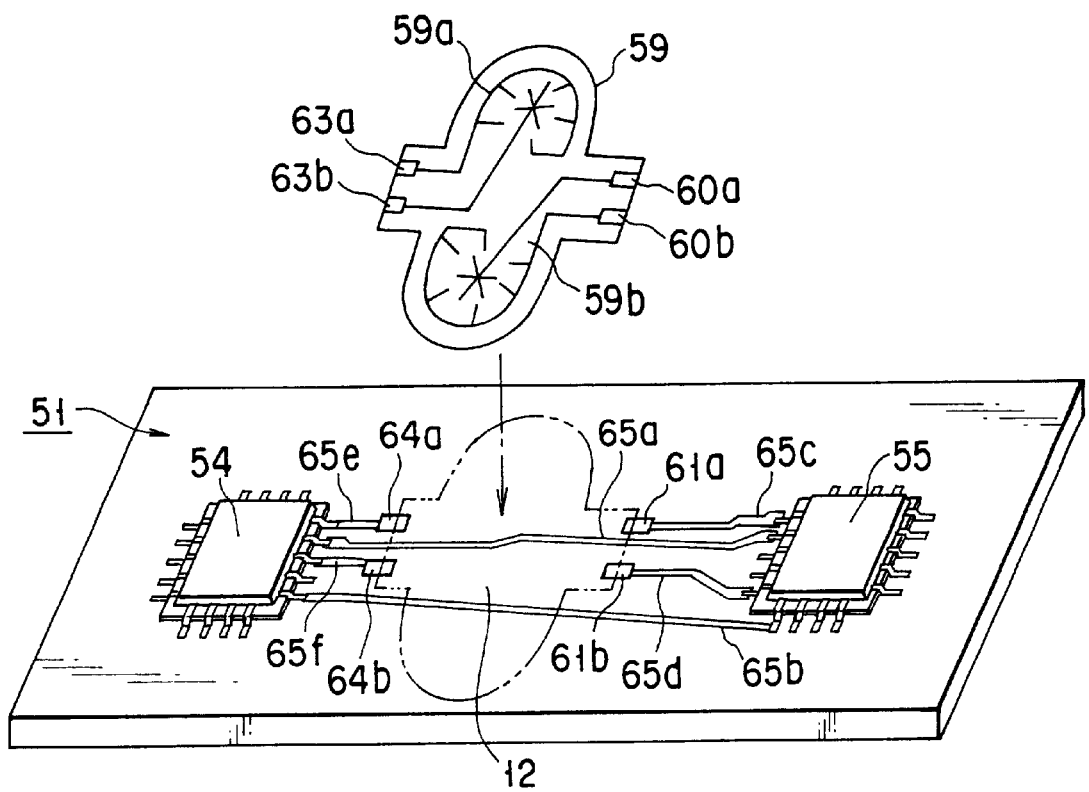
FIG. 5 is a construction view of an electrical board device according to a third embodiment of this invention.

FIG. 5 shows the construction of an electrical board device according to a third embodiment of this invention. The present device corresponds to an improved example of the second embodiment in which the number of switch input patterns formed on a flexible printed wiring board is increased to two.

As shown in FIG. 5, IC chips 54, 55 are formed on a printed wiring board 51 and electrically connected by use of wiring patterns 65a, 65b. Further, two connection lands 61a, 61b are formed on wiring patterns 65c, 65d which are led out from the IC chip 55 and two connection lands 64a, 64b are formed on wiring patterns 65e, 65f which are led out from the IC chip 54.

On a flexible printed wiring board 59, switch input patterns 59a, 59b are formed and connection lands 60a, 60b, 63a, 63b are formed in preset positions of the switch input patterns 59a, 59b.

The flexible printed wiring board 59 is disposed in an arrangement area 62 of the printed wiring board 51 to cover the wiring patterns 65a, 65b so that the connection lands 60a, 60b, 63a, 63b may be electrically connected to the connection lands 61a, 61b, 64a, 64b of the printed wiring board 51 by use of solder or the like.

According to the third embodiment, the space of the printed wiring board 51 can be further efficiently used, the size thereof can be reduced and the cost thereof can be lowered.

A "first printed wiring board" described in the claims corresponds to the printed wiring board 51 and a "second printed wiring board" corresponds to the printed wiring board 59. Further, a "connection terminal pattern" corresponds to the connection lands 60a, 60b, 61a, 61b, 63a, 63b, 64a, 64b.

A plurality of embodiments of this invention have been explained, but this invention is not limited to these embodiments and can be variously modified or improved without departing from the technical scope thereof.

For example, in the above embodiments, the switch input pattern is explained as something which is formed on the flexible printed wiring board, but this is not limitative and various patterns can be formed.

This invention also contains the following inventions.

There is provided an electrical board device for an apparatus characterized by comprising a printed wiring board including at least a wiring pattern for electrically connecting an electrical part to be mounted and a connection terminal pattern, a flexible printed wiring board including at least a connection terminal pattern and a switch input pattern and characterized in that the flexible printed wiring board is superposed on the wiring pattern of the printed wiring board and the two connection terminal patterns are connected to each other.

In the above aspect, the electrical part corresponds to the IC chips 54, 55 and the like, the wiring pattern corresponds to the reference numeral 56, the printed wiring board corresponds to the reference numeral 51 and the flexible printed wiring board corresponds to the reference numerals 52, 59. Further, the connection terminal patterns correspond to the connection lands 57, 58, 60, 61, 63 and the switch input pattern corresponds to the reference numerals 52a, 59a, 59b.

According to the above aspect, since the wiring pattern for electrically connecting the electrical part can be formed without taking the arrangement area of the switch input pattern into consideration, the board can be made small and the cost thereof can be lowered.

(Other Modifications)

This invention has been explained by taking a camera as an example, but this invention can also be applied to other devices or apparatuses and this invention can be variously modified without departing from the technical scope thereof.

As described above, according to this invention, the following effects can be attained.

The pattern and construction of the electrical board are adequately considered so as to be commonly used in devices of different external appearances and devices of the same specification and different external appearances can be provided by mounting the above electrical boards on different devices.

Further, an electrical board device in which the board space can be efficiently used and the board itself can be made small can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method comprising:
    selecting a first apparatus or a second apparatus;
    manufacturing the first apparatus, when the first apparatus is selected, by mounting a first electrical board designed for use in both the first apparatus and the second apparatus, wherein the first electrical board comprises a first switch input pattern to be operated from outside the first apparatus and a first connection land electrically connected to the first switch input pattern; and
    manufacturing the second apparatus, when the second apparatus is selected, by mounting a second electrical board having a second switch input pattern to be operated from outside the second apparatus and a second connection land electrically connected to the second switch input pattern by connecting the first connection land of the first electrical board and the second connection land of the second electrical board to each other.

2. The method according to claim 1, further comprising:
    covering the first apparatus with a first housing; and
    covering the second apparatus with a second housing.

3. The method according to claim 2, wherein:
    the first housing has an operation member positioned at a position corresponding to the first switch input pattern, and
    the second housing has an operation member positioned at a position corresponding to the second switch input pattern.

4. An electrical board system comprising:
    a first electrical board adapted to be used by both a first device and a second device that each have an operation member positioned at respective different positions in the first device and the second device;
    a first switch pattern provided on the first electrical board and located at a predetermined position corresponding to the operation member of the first device, said first switch pattern including a plurality of patterns that are electrically connected to each other and that output switch signals in response to an operation of the operation member of the first device, and said first switch pattern being inoperative when the operation member of the second device is operated;
    a plurality of first connection patterns formed on the first electrical board and electrically connected to the first switch pattern, said plurality of first connection patterns being used exclusively for the second device and being inoperable by the first device;
    a second electrical board adapted to be used by the second device;
    a plurality of second connection patterns formed on the second electrical board and located at predetermined positions, said second connection patterns being adapted to be connected to the first connection patterns formed on the first electrical board; and
    a second switch pattern provided on the second electrical board and located at a predetermined position, said second switch pattern including a plurality of patterns that are electrically connected to the second connection patterns formed on the second electrical board and that are electrically connected to each other and that output switch signals in response to an operation of the operation member of the second device, said second switch pattern being inoperative when the operation member of the first device is operated;
    wherein the first device is structured using only the first electrical board and the second device is structured using both the first electrical board and the second electrical board.

5. An electrical board system according to claim 4, wherein the second electrical board comprises a flexible printed board.

6. An electrical board system according to claim 4, wherein the first electrical board has a predetermined electric appliance mounted thereon.

7. An electrical board system according to claim 4, wherein the first electrical board includes a plurality of switch patterns.

8. An electrical board system according to claim 4, wherein the first connection patterns formed on the first electrical board enable connection to a plurality of different ones of said second electrical board each having a predetermined second switch pattern.

9. An electrical board system according to claim 4, wherein the second electrical board is greater than the first electrical board in terms of an area ratio of: (i) a board surface required for the respective first and second switch patterns to (ii) a board surface other than said board surface required for the respective first and second switch patterns.

10. An electrical board system according to claim 4, wherein the second electrical board has smaller board surface area than the first electrical board.

11. An electrical board system according to claim 4, wherein the second electrical board does not have an electric appliance mounted thereon.

12. An electrical board system comprising:
    a first electrical board adapted to be used by both a first device and a second device, said first device having a first operation member and said second device having a second operation member arranged a position in said second device that is different from a position at which the first operation member is arranged in the first device;
    a first switch pattern provided on the first electrical board and located at a position which corresponds to the first operation member and is inoperable by the second operation member, said first switch pattern including a plurality of patterns that are electrically connected to each other and that output switch signals in response to an operation of the first operation member;
    a plurality of first connection patterns formed on the first electrical board and electrically connected to the first switch pattern, said plurality of first connection patterns being inoperable by the first device;
    a second electrical board adapted to be used by the second device;
    a second switch pattern provided on the second electrical board and located at a position which corresponds to the second operation member and which is inoperable by the first operation member, said second switch pattern including a plurality of patterns that are electrically connected to each other and that output switch signals in response to an operation of the second operation member;

a plurality of second connection patterns formed on the second electrical board and electrically connected to the second switch pattern, said second connection patterns being adapted to be connected to the first connection patterns formed on the first electrical board for use in the second device; and an electric circuit provided on the first electrical board;

wherein the first device is structured using only the first electrical board and the second device is structured using both the first electrical board and the second electrical board; and wherein said electric circuit executes a similar operation when the electric circuit is supplied with a switch signal from the first switch pattern and when the electric circuit is supplied with a second signal from the second switch pattern.

13. An electrical board system according to claim 12, wherein the first device is provided with a first outer casing member that covers the first device and includes the first operation member, and the second device is provided with a second outer casing that covers the second device and includes the second operation member.

14. An electrical board system according to claim 12, wherein the second electrical board comprises a flexible printed board.

15. An electrical board system according to claim 12, wherein the electric circuit comprises a central processing unit.

16. An electrical board system according to claim 12, wherein the second electrical board includes a plurality of switch patterns.

17. An electrical board system according to claim 12, wherein the first connection patterns formed on the first electrical board enable connection to a plurality of different ones of said second electrical board each having a predetermined second switch pattern.

18. An electrical board system according to claim 12, wherein the second electrical board is greater than the first electrical board in terms of an area ratio of: (i) a board surface required for the respective first and second switch patterns to (ii) a board surface other than said board surface required for the respective first and second switch patterns.

19. An electrical board system according to claim 12, wherein the second electrical board has a smaller board surface area than the first electrical board.

20. An electrical board system according to claim 12, wherein the second electrical board does not have an electric appliance mounted thereon.

* * * * *